(12) United States Patent
Solomon et al.

(10) Patent No.: US 10,945,347 B2
(45) Date of Patent: Mar. 9, 2021

(54) TECHNIQUES FOR MAKING HERMETIC FEEDTHROUGHS FOR ENCLOSURES

(71) Applicant: IonQ, Inc., College Park, MD (US)

(72) Inventors: Phillip Solomon, Washington, DC (US); Kai Hudek, Hyattsville, MD (US); Jason Madjdi Amini, Takoma Park, MD (US)

(73) Assignee: IonQ, Inc., College Park, MD (US)

( * ) Notice: Subject to any disclaimer, the term of this patent is extended or adjusted under 35 U.S.C. 154(b) by 0 days.

(21) Appl. No.: 16/708,171

(22) Filed: Dec. 9, 2019

(65) Prior Publication Data

US 2020/0214157 A1 Jul. 2, 2020

Related U.S. Application Data

(60) Provisional application No. 62/785,610, filed on Dec. 27, 2018.

(51) Int. Cl.
| | |
|---|---|
| *H05K 5/06* | (2006.01) |
| *H05K 5/00* | (2006.01) |
| *H01R 25/00* | (2006.01) |
| *H05K 1/18* | (2006.01) |

(52) U.S. Cl.
CPC ........... *H05K 5/069* (2013.01); *H01R 25/006* (2013.01); *H05K 1/18* (2013.01); *H05K 5/0069* (2013.01); *H05K 5/061* (2013.01); *H05K 2201/10189* (2013.01); *H05K 2201/10545* (2013.01)

(58) Field of Classification Search
CPC ...... H05K 5/069; H05K 5/061; H05K 5/0069; H05K 1/18; H05K 2201/10545; H05K 2201/10189; H05K 2201/10151; H05K 1/0272; H01R 25/006
See application file for complete search history.

(56) References Cited

U.S. PATENT DOCUMENTS

| | | | | |
|---|---|---|---|---|
| 6,305,975 | B1 * | 10/2001 | Steiner | H01R 13/5202 174/18 |
| 6,778,389 | B1 * | 8/2004 | Glovatsky | H01L 25/065 165/80.1 |
| 8,493,738 | B2 * | 7/2013 | Chainer | H05K 7/20781 361/700 |
| 10,587,024 | B2 * | 3/2020 | Brannon | H01P 1/2136 |
| 2011/0102991 | A1 * | 5/2011 | Sullivan | G06F 1/20 361/679.02 |

(Continued)

*Primary Examiner* — Abhishek M Rathod
(74) *Attorney, Agent, or Firm* — Arent Fox

(57) ABSTRACT

The disclosure describes various aspects of techniques that can be used for making hermetic feedthroughs for enclosures. For example, a panel that provides a hermetic seal to a system enclosure can include an enclosure board made of a printed circuit board (PCB) and configured to have a size and shape that precisely covers an access to the system enclosure, the enclosure board including multiple inner connectors on an inner side of the PCB facing the inside of the system enclosure and multiple outer connectors on an outer side of the PCB facing the outside the system enclosure for feeding one or more of signals or fluids (e.g., gases, liquids, vacuum) through the PCB by having inner and outer connectors connected through the PCB. The panel may further include a gasket fitting the size and shape of the enclosure board and used with the enclosure board to provide the hermetic seal.

27 Claims, 8 Drawing Sheets

(56) References Cited

U.S. PATENT DOCUMENTS

2016/0234964 A1* 8/2016 Sporer ............... H05K 7/20127
2017/0334375 A1* 11/2017 Shigyo ..................... H02G 3/16
2018/0182514 A1* 6/2018 Sprengers .............. G02B 6/428
2019/0132982 A1* 5/2019 Kim ..................... H05K 5/0069
2020/0144764 A1* 5/2020 Hanselmann ........ H01R 12/592

* cited by examiner

TECHNIQUES FOR MAKING HERMETIC FEEDTHROUGHS FOR ENCLOSURES

CROSS REFERENCE TO RELATED APPLICATION

The present application claims priority to and the benefit from U.S. Provisional Patent Application No. 62/785,610, entitled "TECHNIQUES FOR MAKING HERMETIC FEEDTHROUGHS FOR ENCLOSURES," and filed Dec. 27, 2018, the contents of which are incorporated herein by reference in their entirety.

BACKGROUND OF THE DISCLOSURE

Aspects of the present disclosure generally relate to hermetic seals, and more specifically, to techniques for implementing or making hermetic feedthroughs for enclosures.

Particulate contamination and environmental variations surrounding a quantum computer, a quantum information processing (QIP) system, or a quantum processing unit (QPU) can negatively impacts system performance. Typically a hermetic seal is applied to the perimeter of the system enclosure to reduce these effects. In order to pass signals into and/or out of the enclosure (feedthrough), however, the hermetic seal would need to be broken.

To maintain the seal around each feedthrough (e.g., each connection between the outside and the inside of the system enclosure), gaskets may be used by filling the space between the connector and the enclosure panel. The face of the connector, however, will still be breaking the hermetic seal. An external cap over the connector may be used to maintain the hermetic seal, but to connect a cable or duct to the connector the cap needs to be removed, thus temporarily breaking the seal.

Rather than using an external cap on the connector face, there are special connectors available that have a built-in hermetic seal. These types of connectors, however, are typically cost-prohibitive, require a long lead-time, and only come in certain limited configurations. Therefore, using these types of special connectors limits easy and cost-effective configuration of feedthroughs in an enclosure panel.

Another approach that may be used is to maintain the hermetic seal by eliminating the connector interface and directly passing the cable through an access point (e.g., orifice or hole) in the enclosure panel and using potting compound around the cable to maintain the hermetic seal. This approach, however, reduces feasibility of system maintenance as the potted cable is difficult to replace.

Accordingly, techniques are desirable that can enable cost effective solutions as well as flexible configurations and ease of maintenance when providing hermetically sealed feedthroughs to system enclosures housing quantum computers, QIP systems, or QPUs.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, various techniques are described for implementing or making hermetic seals that enable feedthroughs for different types of enclosures, including enclosures housing quantum computers, quantum information processing (QIP) systems, or quantum processing units (QPUs).

In an aspect of the disclosure, a panel that provides a hermetic seal to a system enclosure includes an enclosure board made of a printed circuit board (PCB) and configured to have a size and shape that precisely covers an access to the system enclosure, the enclosure board including multiple inner connectors on an inner side of the PCB facing the inside of the system enclosure and multiple outer connectors on an outer side of the PCB facing the outside the system enclosure for feeding one or more of signals, fluids, or gases through the PCB by having the inner connectors connected with the outer connectors through the PCB. The panel further includes a gasket fitting the size and shape of the enclosure board and used with the enclosure board to provide the hermetic seal.

Each of the aspects described above can also be used in connection with enclosures other than those housing quantum computers, QIP systems, or QPUs.

BRIEF DESCRIPTION OF THE DRAWINGS

The appended drawings illustrate only some implementation and are therefore not to be considered limiting of scope.

DETAILED DESCRIPTION

Figure 1A:
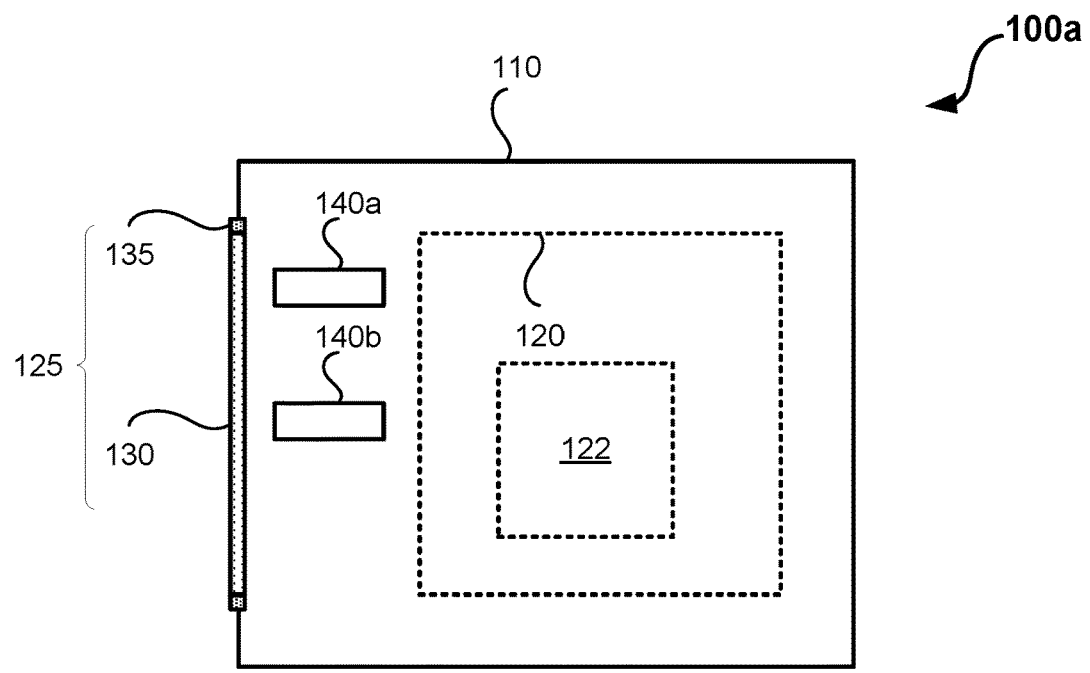
FIG. 1A illustrates a cross sectional view of a system enclosure with a panel to provide a hermetic seal, in accordance with aspects of the disclosure.

Reference will now be made in detail to example aspects of implementations, examples of which are illustrated in the accompanying figures. The following description refers to the accompanying figures in which the same numbers in different figures represent the same or similar elements unless otherwise represented. The implementations set forth in the following description do not represent all implementations consistent with the disclosure. Instead, they are merely examples of structures and/or processes consistent with aspects of implementations related to the disclosure as recited in the claims. For example, although some aspects of the disclosure are described in the context of providing hermetic seals for quantum system enclosures, however, these aspects may also be applicable to other types of system enclosures not associated with quantum computations.

The approach proposed in this disclosure is to use a printed circuit board (PCB) acting as an enclosure panel, fabricated using standard technologies to both seal the enclosure and easily feed signals through the enclosure. This approach reduces cost by eliminating specially designed hermetic connectors and allows for ease of system maintenance by allowing the use of any standard connector/cable interface. As used herein, a "feedthrough" may refer to a mechanism, structure, or components that enable a signal or fluid (our use of the term "fluid" shall be understood to refer to a gas, liquid, and even vacuum) to pass from one side of the PCB to the other side of the PCB without breaking the hermetic seal. The PCB may therefore be configured to provide multiple "feedthroughs" and/or different types of "feedthroughs" and such "feedthroughs" may be single-directional (e.g., from one side of the PCB board to the other side of the PCB) or bi-directional (e.g., from either side of the PCB to the opposite side of the PCB).

In one implementation, connectors (e.g., electrical connectors, fluid couplers) are soldered to both the inner and outer sides of the PCB. A cable inside the system enclosure connects a device (e.g., sensor, component of a quantum computer, QIP system, or QPU) to the inner side of the PCB panel. The PCB then routes the signals to the corresponding connector on the outer side of the PCB, thus hermetically passing the signal in/out of the enclosure. The solder used to place each connector provides a hermetic seal, and the perimeter of the board may requires the use of a single gasket.

Using a PCB also allows for easy implementation of more intricate circuit designs than just signal feedthrough. However, this may require additional electrical vias to complete the circuit. Normally these vias would break the hermetic seal unless, for example, an IPC 4761 Type-VII via (filled and capped via) is used. These types of vias would significantly add cost to the PCB fabrication. To reduce cost, this disclosure proposes instead to use standard PCB fabrication processes with small diameter vias in conjunction with a hot air solder leveling (HASL) finish. The inherent process of HASL fills the vias with a solder mask thus sealing each conductive hole, eliminating the need for special purpose via fabrication processes.

FIG. 1A shows a diagram 100a of a cross sectional view of a system enclosure 110 with a panel 125 (also referred to as an enclosure panel) having an enclosure board 130 and a gasket 135 to provide a hermetic seal to the system enclosure 110. The enclosure board 130 is made of a PCB (although multiple PCBs may also be used) and is configured to have a size and shape (e.g., a profile) that precisely matches and covers an access (e.g., entry point or opening) to the system enclosure 110. The gasket 135 is configured to fit the size and shape of the enclosure board 130 (and thus the size and shape of the access to the system enclosure 110) and is used to surround the enclosure board 130 to provide the hermetic seal.

It is to be understood that the system enclosure 110 is merely shown as a rectangular shape in the diagram 100a for illustration purposes only, and in any actual representation the system enclosure 110 can have any type of shape and/or size.

The PCB of the enclosure board 130 can have an inner side facing the inside of the system enclosure 110, and an outer side facing the outside of the system enclosure 110. The enclosure board 130 can include multiple inner connectors on the inner side of the PCB facing the inside of the system enclosure 110 (see e.g., FIG. 2B), and multiple outer connectors on the outer side of the PCB facing the outside the system enclosure 110 (see e.g., FIG. 2B) for feeding one or more of signals or fluids (that can include a gas, liquid or vacuum) through the PCB. This is accomplished by having the inner connectors connected with the outer connectors through the PCB. There may be instances in which the number of inner connectors and outer connectors is the same, however, there may be other instances in which the numbers are different and there is not a unique one-to-one mapping between inner and outer connectors.

In some implementations, the panel 125 is configured to hermetically seal a vacuum chamber 120 within the system enclosure 110. The vacuum chamber 120 may be associated with a quantum system such as, for example, the QIP system 705 described in more detail below in connection with FIG. 7. For example, a chamber 750 in the QIP system 705 may be enclosed or housed by a hermetically sealed system enclosure such as the system enclosure 110. In some implementations, the vacuum chamber 120 within the system enclosure includes a QIP system 122 such as, for example, the QIP system 705 in FIG. 7.

The diagram 100a also shows components 140a and 140b, which may be examples of sensors or other types of measurement devices or sources of data from within the system enclosure 110. These components 140a and 140b may be connected to other components or devices outside the system enclosure 110 by the various feedthroughs enabled through the connectors on both sides of the enclosure board 130.

Figure 1B:
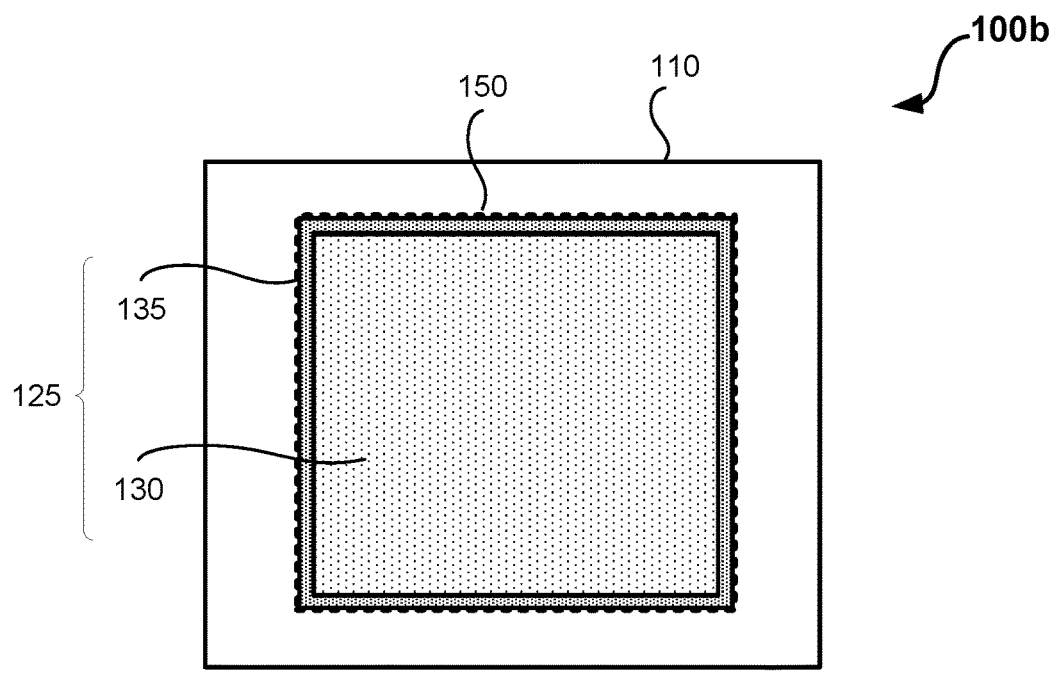
FIG. 1B illustrates a front view of the system enclosure in FIG. 1A, in accordance with aspects of the disclosure.

FIG. 1B shows a diagram 100b that illustrates a front view of the system enclosure 110 in FIG. 1A. In this diagram, the panel 125 is shown with the enclosure board 130 and the gasket 135 fitting the shape and size of an access 150 (dashed line) of the system enclosure 110. It is to be understood that the panel 125 is merely shown as a rectangular shape in the diagram 100b for illustration purposes only, and in any actual representation the panel 125 can have any type of shape and/or size that is suitable for making by using a PCB for the enclosure board 130.

Figure 2A:
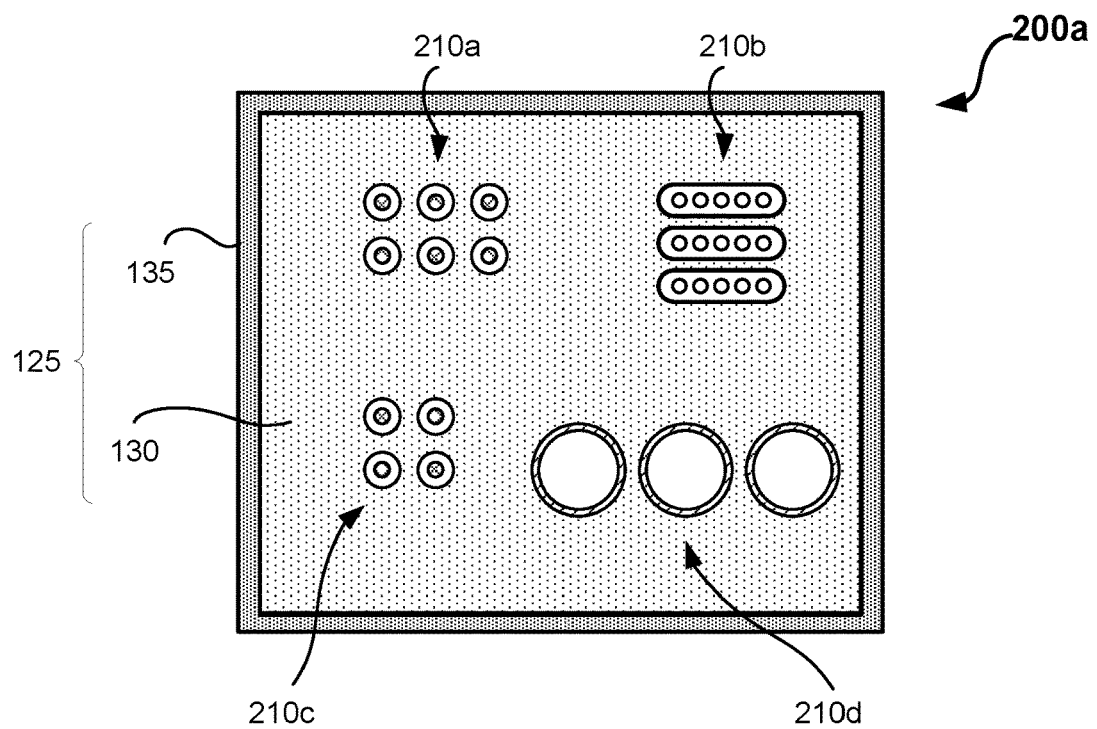
FIG. 2A illustrates a front view of a panel used for providing a hermetic seal and having multiple connectors for feedthroughs, in accordance with aspects of the disclosure.

FIG. 2A shows a diagram 200a that illustrates a front view of the panel 125 having multiple connectors for feedthroughs. In this case, the front view can correspond to the outer side of the enclosure board 130, which is the side that is accessible to a user that wants to, for example, connect a cable to one of the feedthroughs (e.g., outer connectors) to obtain data or measurements from sources within the system enclosure 110 that are connected to the inner side of the enclosure board 130 (not shown), or to provide data or other information to various components housed within the system enclosure 110. As such the connectors that are shown are outer connectors In this example, the outer connectors can include one or more sets of electrical connectors (e.g., set 210a of electrical connectors, set 210b of electrical connectors, and set 210c of electrical connectors), where each set of electrical connectors is located in a different location of the enclosure board 130, and the electrical connectors in each set are arranged in an array or other configuration for ease of identification and access by a user. The outer connectors can include one or more sets of fluid couplers (e.g., set 210d of fluid couplers) that are also located, arranged, and/or configured for ease of identification and access by a user.

Figure 2B:
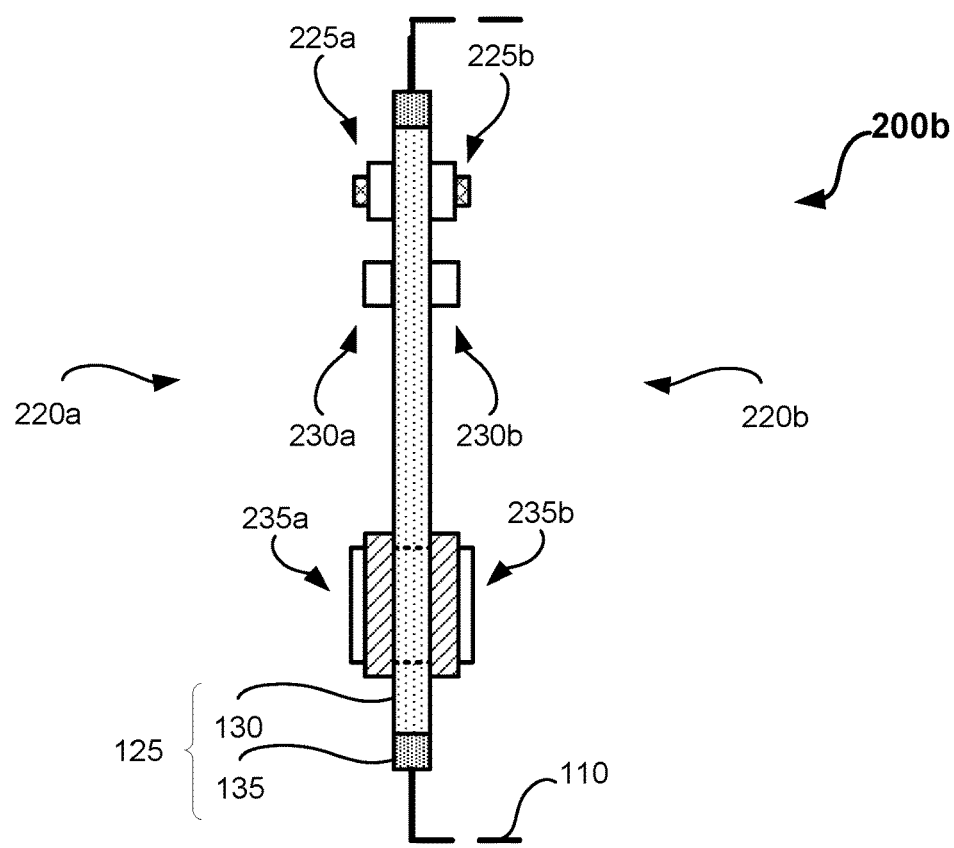
FIG. 2B illustrates a side view of the panel in FIG. 2A, in accordance with aspects of the disclosure.

FIG. 2B shows a diagram 200b that illustrates a side view of the panel 125 in FIG. 2A. The outer side of the enclosure board 130 (e.g., the PCB) is identified as 220a and the inner side as 220b. The outer connectors on the outer side 220a include electrical connectors 225a and 225b, and can optionally include a fluid coupler 235a. The respective inner connectors of the inner side 220b include electrical connectors 230a and 230b, and can optionally include a fluid coupler 235b. The electrical connectors can be hermetically sealed by solder used to connect and/or attach the electrical connector to the PCB. If a fluid coupler is used, the fluid coupler can be sealed with a sealant such that when ducts, pipes, or tubes are attached (see e.g., FIG. 2C) the hermetic sealed provided by the panel 125 is maintained even when fluid couplers are used.

In this example, the electrical connectors 225a and 225b are electrically connected to each other through, for example, vias and/or traces in the PCB. The electrical connectors 225a and 225b are also collocated or located in the same place but on different sides of the PCB. The same for the electrical connectors 230a and 230b.

Moreover, the fluid couplers 235a and 235b are also collocated or located in the same place but on different sides of the PCB such that they are aligned with an opening or hole (dotted line) inside the enclosure board 130 to allow fluids and/or gasses to pass from one side to the other side (gas or fluid feedthrough).

In general, outer connectors (e.g., electrical connectors 225a and 230a, fluid couplers 235a) are connected or in alignment with inner connectors (e.g., electrical connectors 225b and 230b, fluid couplers 235b) of the same type, although there may be instances in which the connectors are mismatched (e.g., are of different types).

Figure 2C:
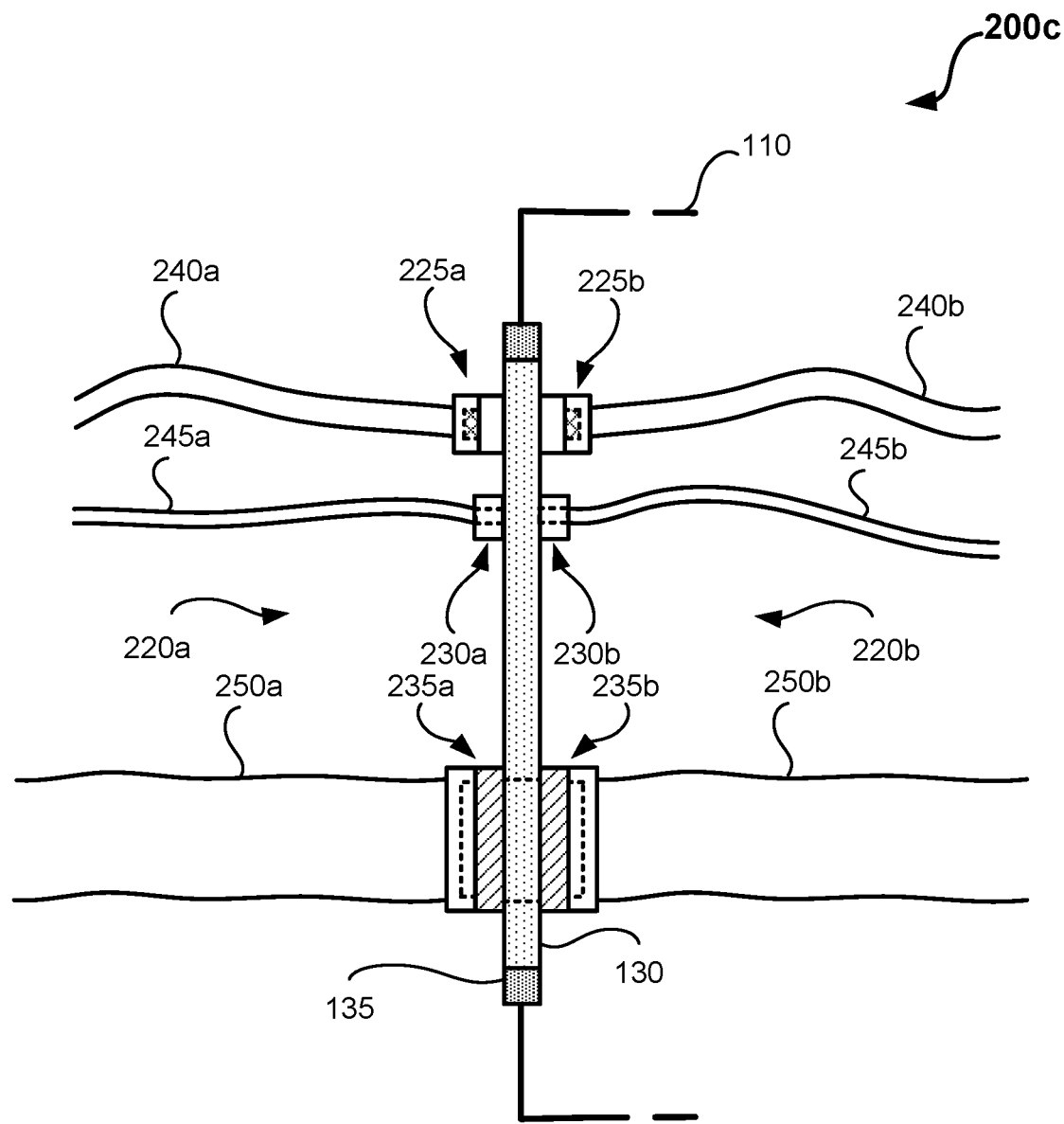
FIG. 2C illustrates a side view of the panel in FIG. 2A with cables and ducts attached, in accordance with aspects of the disclosure.

FIG. 2C shows a diagram 200c that illustrates a side view of the panel 125 in FIG. 2A with cables and ducts attached. The electrical connectors 225a, 225b, 230a, and 230b are configured to be coupled to individual cables. The electrical connectors 225a, 225b, 230a, and 230b can maintain the hermetic seal even when not connected to a cable. In this example, the electrical connectors 225a and 230a are respectively connected to cables 240a and 245a that reside outside the system enclosure 110, while the electrical connectors 225b and 230b are respectively connected to cables 240b and 245b that reside inside the system enclosure 110. The cables 240a and 245a can be further connected to equipment, component, or devices outside the system enclosure 110 that generate and send signals or that receive and process signals. Similarly, the cables 240b and 245b can be further connected to equipment, component, or devices inside the system enclosure 110 that generate and send signals or that receive and process signals.

In an implementation, the connectors 225a and 225b are coaxial connectors and the cables 240a and 240b are coaxial cables, and the connectors 230a and 230b are computer connectors and the cables 245a and 245b are computer cables.

The fluid couplers 235a and 235b are configured to be coupled to individual ducts or tubes (e.g., flexible tubing), or pipes (less flexible, semi-rigid tubing). In this example, the fluid coupler 235a is respectively connected to duct 250a that resides outside the system enclosure 110, while the fluid coupler 235b is respectively connected to duct 250b that resides inside the system enclosure 110.

The example shown in the diagram 200c illustrates the approach proposed in this disclosure in which connections can be made between the inside of the system enclosure 110 and the outside of the system enclosure 110 without breaking the hermetic seal.

Figure 3:
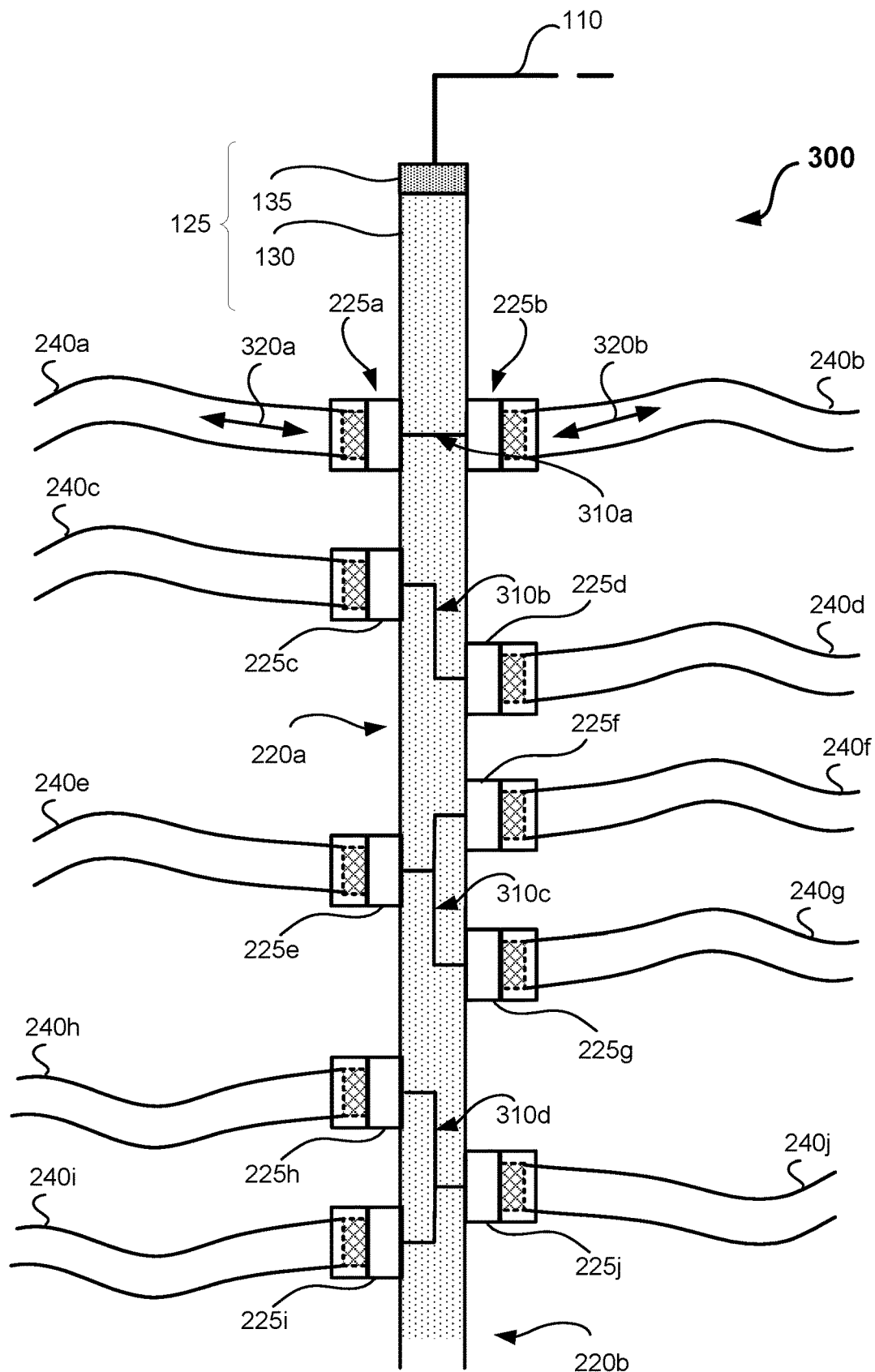
FIG. 3 illustrates a side view of a panel used for providing a hermetic seal and having multiple connector arrangements for feedthroughs, in accordance with aspects of the disclosure.

FIG. 3 shows a diagram 300 illustrating a side view of the panel 125 having multiple connector arrangements for feedthroughs. The examples provided in the diagram 300 are not meant to be exhaustive, rather, they are intended to be illustrative of the types of connection configurations that can be made with different types of electrical connectors because of the flexibility of routing signals using the PCB of the enclosure board 130.

In this example, in a first configuration or arrangement, the outer connector 225a is collocated with the inner connector 225b through an electrical connection 310a that includes one or more traces and/or one or more vias. The outer connector 225a is coupled to a cable 240a that is outside the system enclosure 110 and the inner connector 225b is coupled to a cable 240b that is inside the system enclosure 110. The cable 240a can carry one or more signals 320a and the cable 240b can carry one or more signals 320b, where the signals can be single-directional (to or from the inside of the system enclosure 110) or bi-directional (to and from the inside of the system enclosure 110).

The one or more signals 320a can be, for example, one or more of a radio frequency (RF) signal, a microwave signal, a power signal, a control signal, or a data signal that are to be used within the system enclosure 110. The one or more signals 320b can be, for example, one or more of a measurement signal generated by a sensor (e.g., components 140a and/or 140b in the diagram 110a) within the system enclosure 110 or a data signal generated within the system enclosure 110 (e.g., by the components 140a and/or 140b).

In a second configuration or arrangement, an outer connector 225c is not collocated with an inner connector 225d, but they are electrically connected through an electrical connection 310b that includes one or more traces and/or one or more vias. The outer connector 225c is coupled to a cable 240c that is outside the system enclosure 110 and the inner connector 225d is coupled to a cable 240d that is inside the system enclosure 110. These cables can carry single directional signals and/or bi-directional signals.

In a third configuration or arrangement, an outer connector 225e need not be collocated with inner connectors 225f and 225g, but these connectors are all electrically connected through an electrical connection 310c that includes one or more traces and/or one or more vias. The outer connector 225e is coupled to a cable 240e that is outside the system enclosure 110 and the inner connectors 225f and 225g are coupled to cable 240f and 240g, respectively, that are inside the system enclosure 110. These cables can carry single directional signals and/or bi-directional signals. This configuration or arrangement allows for, for example, a signal provided by the cable 240e to be split into separate signals provided to the cables 240f and 240g, and similarly, signals provided by cables 240f and 240g can be combined into a single signal provided to the cable 240e.

In one implementation, the connector 225e and the cable 240e can carry multiple signals from outside the system enclosure 110, some of those signals (e.g., a first subset of the signals) could be connected or passed to the connector 225f and the cable 240f, and the remaining signals (e.g., a second subset of the signals) could be connected or passed to the connector 225g and the cable 240g. In such a scenario, the type of the connector 225*e* and the types of the connectors 225*f* and 225*g* need not be the same. There may be scenarios where there can be more than two inner connectors to which the various signals from the outer connector are provided. Examples include individual RF connectors on the inner side of the PCB, and a ganged RF connector on the outer side of the PCB.

In a fourth configuration or arrangement, outer connectors 225*h* and 225*i* need not be collocated with an inner connector 225*j*, but they are all electrically connected through an electrical connection 310*d* that includes one or more traces and/or one or more vias. The outer connectors 225*h* and 225*i* are coupled to cables 240*h* and 240*i*, respectively, that are outside the system enclosure 110 and the inner connector 225*j* is coupled to a cable 240*j* that is inside the system enclosure 110. These cables can carry single directional signals and/or bi-directional signals. This configuration or arrangement allows for, for example, a signal provided by the cable 240*j* to be split into separate signals provided to the cables 240*h* and 240*i*, and similarly, signals provided by cables 240*h* and 240*i* can be combined into a single signal provided to the cable 240*j*.

In one implementation, the connector 225*j* and the cable 240*j* can carry multiple signals from inside the system enclosure 110, some of those signals (e.g., a first subset of the signals) could be connected or passed to the connector 225*h* and the cable 240*h*, and the remaining signals (e.g., a second subset of the signals) could be connected or passed to the connector 225*i* and the cable 240*i*. In such a scenario, the type of the connector 225*j* and the types of the connectors 225*h* and 225*i* need not be the same. There may be scenarios where there can be more than two outer connectors to which the various signals from the inner connector are provided. Examples include individual RF connectors on the outer side of the PCB, and a ganged RF connector on the inner side of the PCB.

It is to be understood from the example in the diagram 300 in FIG. 3 that a panel can have N inner connectors and M outer connectors, where N and M are integers and these integers can be the same or different (e.g., N>M, M>N, N=M). In such a case, signals received by the N inner connectors can be matched to corresponding ones of the M outer connectors. Similarly, signals received by the M outer connectors can be matched to corresponding ones of the N inner connectors. These types of matching can involve all of the N inner connectors or a subset of the N inner connectors, as well as all of the M outer connectors or a subset of the M outer connectors.

Figure 4:
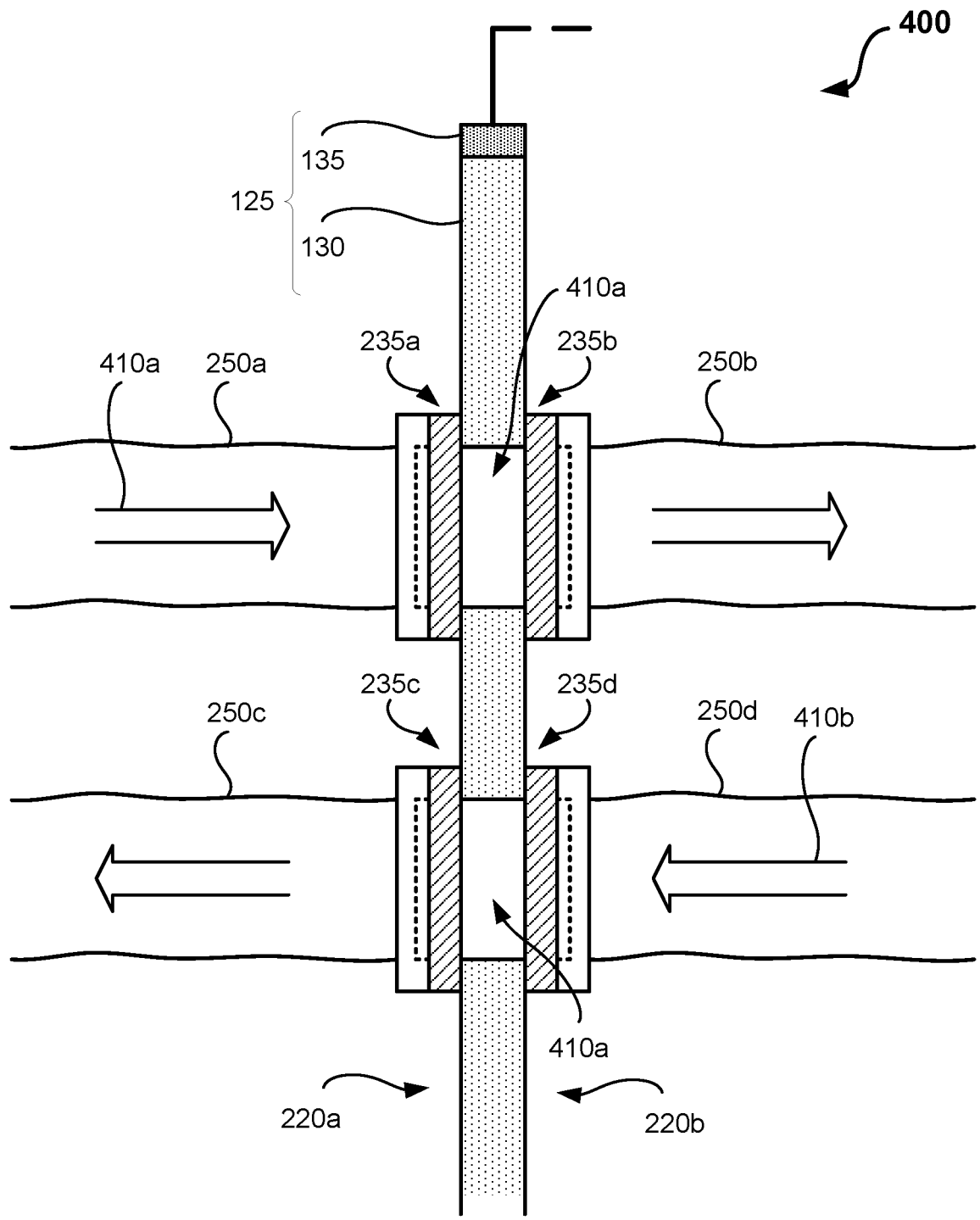
FIG. 4 illustrates a side view of a panel used for providing a hermetic seal and having multiple fluid connectors with attached ducts for feedthroughs, in accordance with aspects of the disclosure.

FIG. 4 shows a diagram 400 that illustrates a side view of the panel 125 having multiple fluid connectors with attached ducts, tubes or pipes for feedthroughs. Fluid can include a gas, liquid or vacuum. Fluid connectors can be used alone or in combination with electrical connectors as shown in the diagrams 200*b* and 200*c* in FIGS. 2B and 2C, respectively. The examples provided in the diagram 400 are not meant to be exhaustive, rather, they are intended to be illustrative of the types of connection configurations that can be made with fluid couplers using the PCB of the enclosure board 130.

In a configuration or arrangement, the fluid coupler 235*a* is coupled to a duct or tube 250*a* (e.g., flexible tube or pipe) that is configured to provide a fluid or gas 410*a* to the fluid coupler 235*b* through a hole, orifice, or opening 410*a* in the PCB of the enclosure board 130 such that the fluid or gas 410*a* is further provided to a duct or tube 250*b* coupled to the fluid coupler 235*b* and therefore into the system enclosure 110.

Similarly, a fluid coupler 235*d* is coupled to a duct or tube 250*d* that is configured to provide a fluid or gas 410*b* to the fluid coupler 235*c* through a hole, orifice, or opening 410*b* in the PCB of the enclosure board 130 such that the fluid or gas 410*b* is further provided to a duct or tube 250*c* coupled to the fluid coupler 235*c* and therefore outside of the system enclosure 110.

In an example, the fluid 410*a*, the fluid 410*b*, or both can include purging air, water, or coolant. Moreover, the duct or tube 250*c* can be connected to a system that pulls vacuum from the system enclosure 110 through the fluid couplers 235*c* and 235*d* (e.g., with or without the use of the duct or tube 250*d*).

Figure 5:
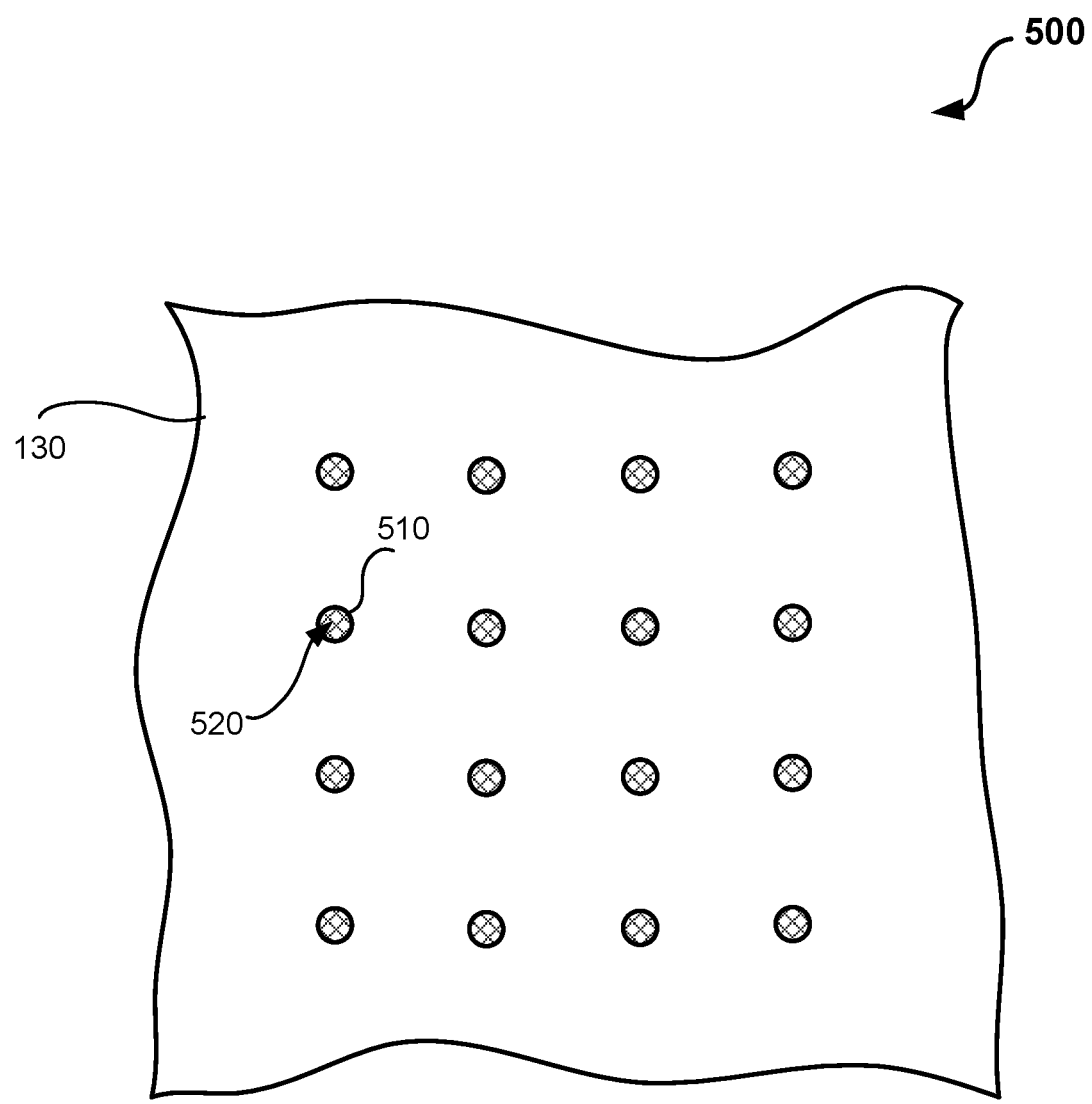
FIG. 5 illustrates a partial view of PCB used as part of a panel for providing a hermetic seal, in accordance with aspects of the disclosure.

FIG. 5 shows a diagram 500 with a partial view of the PCB of the enclosure board 130 having multiple vias 510. Although only one side of the PCB is shown, the vias 510 can pass through the entire thickness of the PCB. Some of the vias 510 can be used to physically attach connectors (e.g., electronic connectors) to either side of the PCB, which are then electrically connected to connectors on the other side of the PCB through the vias 510 and/or traces that are on and/or inside the PCB. Moreover, when one or more active electronic circuits are also used on either side of the PCB (see e.g., FIG. 6), the electronic circuits can also be attached and/or connected using the vias 510. To maintain hermetic seal given than the vias 510 are openings in the PCB, the vias 150 are generally made to be smaller than standard vias and are treated with a hot air solder leveling (HASL) finish 520 to maintain the hermetic seal. This treatment may be used for vias 150 that are unused as well as for vias 150 that are used for attachment and/or connectivity.

Figure 6:
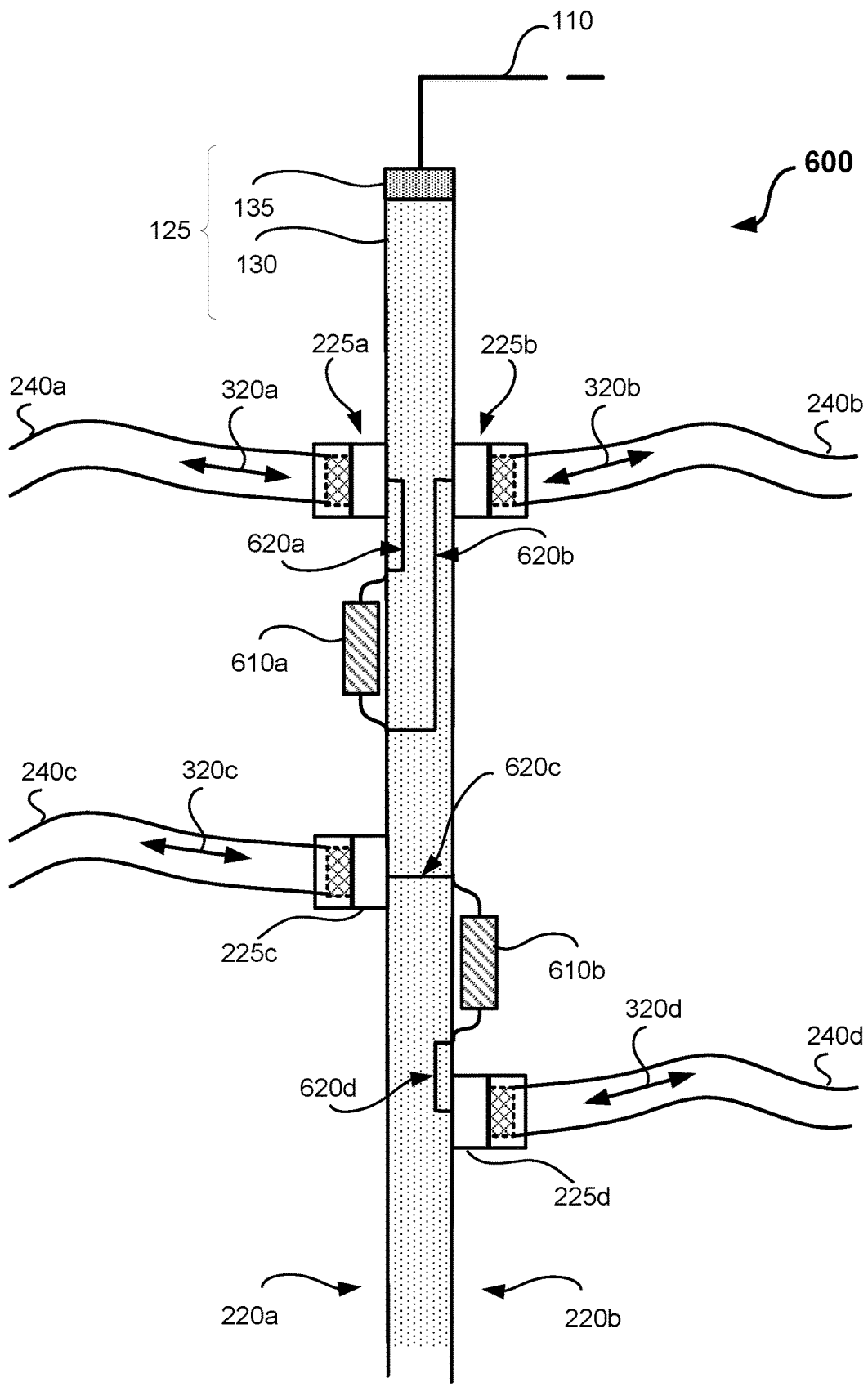
FIG. 6 illustrates a side view of a panel used for providing a hermetic seal and having multiple electrical connectors for feedthroughs as well as active electronic circuits, in accordance with aspects of the disclosure.

FIG. 6 shows a diagram 600 of a side view of the panel 125 having multiple electrical connectors for feedthroughs as well as active electronic circuits. In this example, a couple of the configurations shown in the diagram 300 of FIG. 3 are used for illustration purposes. The connectors 225*a* and 225*b*, which are coupled to cables 240*a* and 240*b*, respectively, can be electrically connected to each other through the PCB of the enclosure board 130. In this case, however, signals being sent through the cables and the connectors can be processed by an active or passive electronic circuit 610*a* on the outer side 220*a* of the enclosure board 130 (e.g., the outer side of the panel 125). The active or passive electronic circuit 610*a* can be configured to perform various operations on the signals. In an example, the active electronic circuit 610*a* can be a microprocessor, a field programmable gate array (FPGA), or an application specific integrated circuit (IC) that performs different types of programmed operations on the signals. In another example, the active or passive electronic circuit 610*a* can perform specific operations such as filtering, amplification, and the like. The active electronic circuit 610*a* is electrically connected to the connectors 225*a* and 225*b* through traces and/or vias 620*a* and 620*b*, for example.

The connectors 225*c* and 225*d*, which are coupled to cables 240*c* and 240*d*, respectively, can be electrically connected to each other through the PCB of the enclosure board 130. In this case, however, signals being sent through the cables and the connectors can be processed by an active electronic circuit 610*b* on the inner side 220*b* of the enclosure board 130 (e.g., the inner side of the panel 125). The active electronic circuit 610*b* can be configured to perform various operations on the signals just like the active electronic circuit 610*a* described above. The active electronic circuit 610b is electrically connected to the connectors 225c and 225d through traces and/or vias 620c and 620d, for example.

In another example (not shown in the diagram 600), there could be active electronic devices on both sides of the PCB of the enclosure board 130 to process signals from electrically connected connectors.

Figure 7:
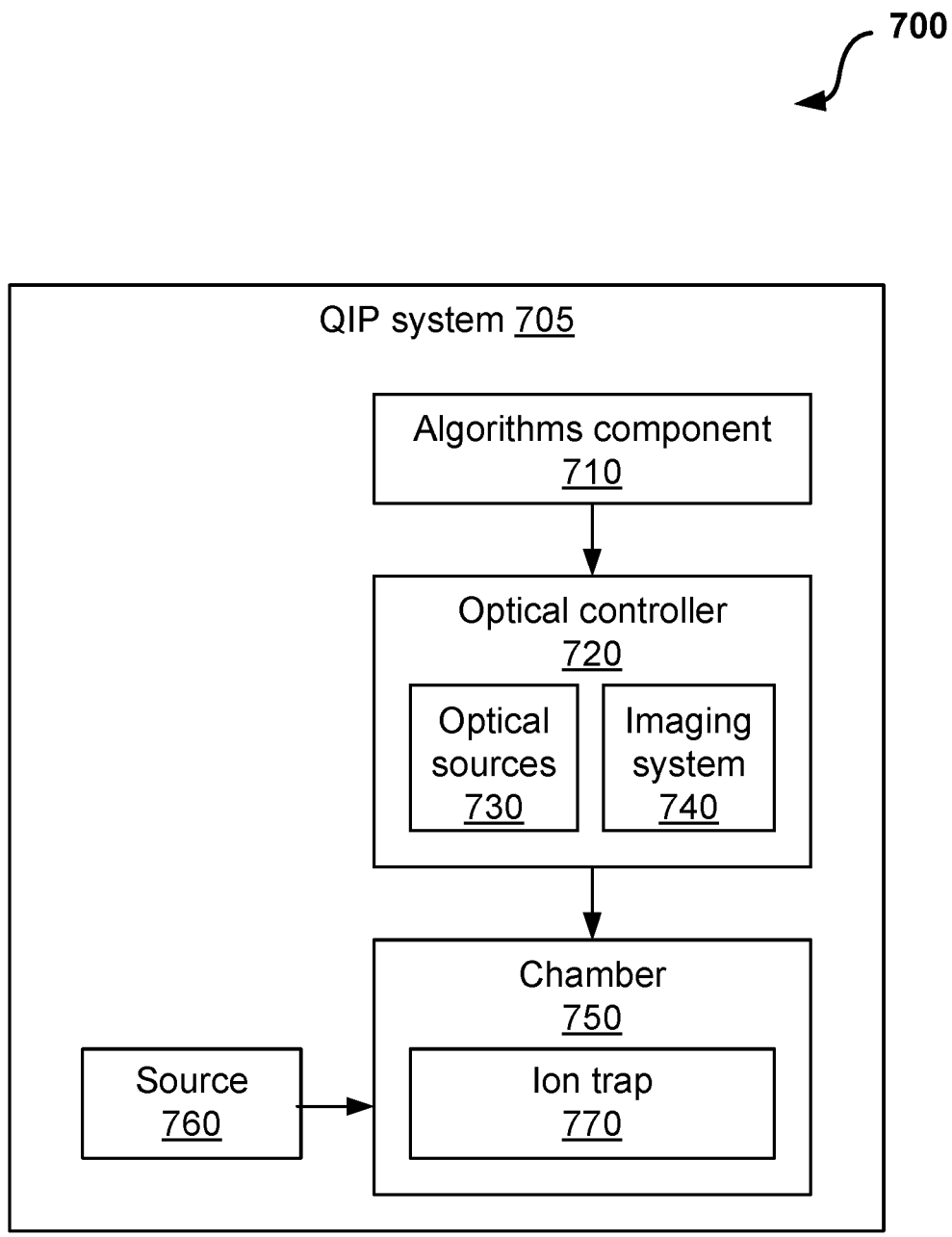
FIG. 7 is a block diagram that illustrates an example of a quantum information processing (QIP) system that can be housed within a hermetically sealed system enclosure, in accordance with aspects of this disclosure.

FIG. 7 shows a block diagram 700 of the QIP system 705, which can have at least some portions housed within the hermetically sealed system enclosure 110. The QIP system 705 may also be referred to as a quantum computing system, a computer device, or the like. The QIP system 705, which is described in more detail below, is based on trapped ion technology, however, other types of QIP systems can also be housed within the system enclosure 110 that are based on different technologies, such as superconducting technologies, for example.

The QIP system 705 can include a source 760 that provides atomic species (e.g., a flux of neutral atoms) to a chamber 750 having an ion trap 770 that traps the atomic species once ionized (e.g., photoionized) by an optical controller 720. In another aspect, the ion trap 770 may be referred to as a trap, a surface trap, an atom trap, or an atomic lattice that may be configured to trap or confine different atomic species. Optical sources 730 in the optical controller 720 may include one or more laser sources that can be used for ionization of the atomic species, control (e.g., phase control) of the atomic ions, for fluorescence of the atomic ions that can be monitored and tracked by image processing algorithms operating in an imaging system 740 in the optical controller 720, and overall for optical control of operations implemented using the atomic ions. The imaging system 740 can include a high resolution imager (e.g., CCD camera) for monitoring the atomic ions in the ion trap 770. In an aspect, the imaging system 740 can be implemented separate from the optical controller 720.

The QIP system 705 may also include an algorithms component 710 that may operate with other parts of the QIP system 705 (not shown) to perform quantum algorithms or quantum operations. As such, the algorithms component 710 may provide instructions to various components of the QIP system 705 to enable the implementation of the quantum algorithms or quantum operations.

At least some portions of the QIP system 705, such as the chamber 750 with the ion trap 770, can be housed inside the system enclosure 110 to protect it from particulate contamination and environmental variations. In such a case, certain signals and/or fluids used for the operation of the QIP system 705 may be sent inside the system enclosure 110 by feedthroughs in the panel 125, while certain signals and/or fluids generated by the operations of the QIP system 705 may be sent outside the system enclosure 110 by feedthroughs in the panel 125, all without breaking the hermetic seal provided by the panel 125.

Although the present disclosure has been provided in accordance with the implementations shown, one of ordinary skill in the art will readily recognize that there could be variations to the implementations and those variations would be within the scope of the present disclosure. Accordingly, many modifications may be made by one of ordinary skill in the art without departing from the scope of the appended claims.

What is claimed is:

1. A panel that provides a hermetic seal to a system enclosure, comprising:
   an enclosure board made of a printed circuit board (PCB) and configured to have a size and shape that precisely covers an access to the system enclosure, the enclosure board including multiple inner connectors on an inner side of the PCB facing the inside of the system enclosure and multiple outer connectors on an outer side of the PCB facing the outside the system enclosure for feeding one or more signals and one or more fluids through the PCB by having the inner connectors connected with the outer connectors through the PCB, the fluids including one or more of gases, liquids, or vacuum; and
   a gasket fitting the size and shape of the enclosure board and used with the enclosure board to provide the hermetic seal.

2. The panel of claim 1, wherein:
   the outer connectors include a first electrical connector configured to be coupled to a first cable that resides outside the system enclosure, and
   the inner connectors include a second electrical connector that corresponds to and is electrically connected with the first electrical connector through the PCB, and is configured to be coupled to a second cable that resides within the system enclosure.

3. The panel of claim 2, wherein the first cable and the second cable are both coaxial cables or computer cables.

4. The panel of claim 2, wherein:
   the first electrical connector is configured to provide a first signal from the first cable to the second electrical connector through the PCB for the first signal to be available to the second cable without breaking the hermetic seal,
   the second electrical connector is configured to provide a second signal from the second cable to the first electrical connector through the PCB for the second signal to be available to the first cable without breaking the hermetic seal, or
   a combination thereof.

5. The panel of claim 4, wherein:
   the enclosure board includes one or more active or passive electronic circuits on the outer side of the PCB to process the first signal, the second signal, or both,
   the enclosure board includes one or more active or passive electronic circuits on the inner side of the PCB to process the first signal, the second signal, or both, or
   a combination thereof.

6. The panel of claim 5, wherein the PCB includes multiple vias for the one or more active electronic circuits on the outer side of the PCB, for the one or more active electronic circuits on the inner side of the PCB, or for both, and the multiple vias are small diameter vias treated with a hot air solder leveling (HASL) finish to maintain the hermetic seal.

7. The panel of claim 2, wherein the first electrical connector is of a same type as the second electrical connector.

8. The panel of claim 2, wherein a location of the first electrical connector on the inner side of the PCB is different from a location of the second electrical connector on the outer side of the PCB, the electrical connection between the first electrical connector and the second electrical connector being made by one or more traces in the PCB that connect the two locations.

9. The panel of claim 1, wherein the outer connectors include an electrical connector configured to provide to one or more of the inner connectors a radio frequency (RF) signal, a microwave signal, a power signal, a control signal, or a data signal that is to be used within the system enclosure.

10. The panel of claim 1, wherein the inner connectors include an electrical connector configured to provide to one or more of the outer connectors a measurement signal generated by a sensor within the system enclosure.

11. The panel of claim 1, wherein the inner connectors include an electrical connector configured to provide to one or more of the outer connectors a data signal generated within the system enclosure.

12. The panel of claim 1, wherein the inner connectors include an electrical connector that is hermetically sealed by solder used to connect the electrical connector to the PCB.

13. The panel of claim 1, wherein the outer connectors include an electrical connector that is hermetically sealed by solder used to connect the electrical connector to the PCB.

14. The panel of claim 1, wherein the outer connectors include one or more sets of electrical connectors, each set of electrical connectors located in a different location of the outer side of the PCB, and the electrical connectors in each set being arranged in an array for ease of identification and access.

15. The panel of claim 1, wherein:
the outer connectors include first fluid couplers configured to receive a gas or fluid, and
the inner connectors include second fluid couplers, each of which corresponds to one of the first fluid couplers through the PCB and is configured to introduce the gas or fluid from the respective first fluid coupler into the system enclosure.

16. The panel of claim 15, wherein the fluid includes processing gas, purging air/gas, water, coolant, or vacuum.

17. The panel of claim 1, wherein:
the outer connectors include a first fluid coupler, and
the inner connectors include a second fluid coupler that corresponds to the first fluid coupler through the PCB, the first fluid coupler being configured to be coupled to a system that pulls vacuum from the system enclosure through the second fluid coupler.

18. The panel of claim 1, wherein:
the outer connectors include a first fluid coupler configured to be coupled to a first duct outside of the system enclosure, the first duct being configured to provide a fluid to be introduced into the system enclosure, and
the inner connectors include an second fluid coupler corresponding to the first fluid connector and configured to be coupled to a second duct within the system enclosure to introduce into the system enclosure the fluid.

19. The panel of claim 1, wherein the enclosure board and the gasket are configured to hermetically seal a vacuum chamber within the system enclosure.

20. The panel of claim 19, wherein the vacuum chamber within the system enclosure includes a quantum information processing (QIP) system.

21. The panel of claim 1, wherein a number of inner connectors is different from a number of outer connectors.

22. The panel of claim 1, wherein:
the outer connectors include a first electrical connector configured to be coupled to a first cable that resides outside the system enclosure,
the inner connectors include a second electrical connector and third electrical connector respectively configured to be coupled to a second cable and a third cable that reside inside the system enclosure,
signals carried by the first electrical connector and the first cable include a first subset of signals and a second subset of signals, the first subset of signals being passed to the second electrical connector and the second cable and the second subset of signals being passed to the third electrical connector and the third cable.

23. The panel of claim 22, wherein the first electrical connector is a radio frequency (RF) ganged connector, and the second electrical connector and the third electrical connectors are individual RF connectors.

24. The panel of claim 1, wherein:
the inner connectors include a first electrical connector configured to be coupled to a first cable that resides inside the system enclosure,
the outer connectors include a second electrical connector and third electrical connector respectively configured to be coupled to a second cable and a third cable that reside outside the system enclosure,
signals carried by the first electrical connector and the first cable include a first subset of signals and a second subset of signals, the first subset of signals being passed to the second electrical connector and the second cable and the second subset of signals being passed to the third electrical connector and the third cable.

25. The panel of claim 24, wherein the first electrical connector is an RF ganged connector, and the second electrical connector and the third electrical connectors are individual RF connectors.

26. The panel of claim 1, wherein:
the multiple inner connectors include N inner connectors,
the multiple outer connectors include M outer connectors, and
signals received by the N inner connectors are matched to corresponding ones of the M outer connectors.

27. The panel of claim 1, wherein:
the multiple inner connectors include N inner connectors,
the multiple outer connectors include M outer connectors, and
signals received by the M outer connectors are matched to corresponding ones of the N inner connectors.

* * * * *